United States Patent
Kim (10) Patent No.: US 9,922,909 B2
(45) Date of Patent: Mar. 20, 2018

(54) DISPLAY DEVICE

(71) Applicant: Samsung Display Co., Ltd., Yongin-si, Gyeonggi-do (KR)

(72) Inventor: Nam Jin Kim, Suwon-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/299,371

(22) Filed: Oct. 20, 2016

(65) Prior Publication Data

US 2017/0117346 A1     Apr. 27, 2017

(30) Foreign Application Priority Data

Oct. 23, 2015  (KR) .......................... 10-2015-0148198

(51) Int. Cl.
| | |
|---|---|
| H01L 23/29 | (2006.01) |
| H01L 21/00 | (2006.01) |
| H01L 23/495 | (2006.01) |
| H01L 21/48 | (2006.01) |
| H01L 23/498 | (2006.01) |
| H01L 41/047 | (2006.01) |
| H01L 51/52 | (2006.01) |
| H01L 27/32 | (2006.01) |

(52) U.S. Cl.
CPC .... *H01L 23/49555* (2013.01); *H01L 21/4839* (2013.01); *H01L 23/49861* (2013.01); *H01L 27/3276* (2013.01); *H01L 41/0475* (2013.01); *H01L 51/5253* (2013.01); *H01L 51/5256* (2013.01); *H01L 2251/5338* (2013.01)

(58) Field of Classification Search
CPC ...................... H01L 23/49555; H01L 41/0475
USPC .......... 438/123–127; 257/676, 784, 786, 790
See application file for complete search history.

(56) References Cited

U.S. PATENT DOCUMENTS

| | | | |
|---|---|---|---|
| 9,287,334 B2 * | 3/2016 | Jung | .................... H01L 51/5246 |
| 9,360,748 B2 * | 6/2016 | Lee | .......................... B41M 5/46 |
| 9,370,116 B2 * | 6/2016 | Jo | ............................. H05K 7/02 |

FOREIGN PATENT DOCUMENTS

| | | |
|---|---|---|
| KR | 10-0647702 B1 | 11/2006 |
| KR | 10-2010-0124010 A | 11/2010 |
| KR | 10-2014-0080229 A | 6/2014 |
| KR | 10-2015-0006706 A | 1/2015 |

* cited by examiner

*Primary Examiner* — Calvin Lee
(74) *Attorney, Agent, or Firm* — Knobbe Martens Olson & Bear LLP (57) ABSTRACT

A display device is disclosed. In one aspect, the display device includes a substrate including a display area configured to display an image and a peripheral area surrounding the display area. The display device also includes a plurality of signal lines provided in the display area, an encapsulation layer provided over the signal lines and a pad portion provided in the peripheral area. The display device further includes a plurality of connection wires connecting the signal lines and the pad portion, wherein each of the connection wires includes a first portion provided in the peripheral area and a second portion provided in the display area. A portion of the encapsulation layer provided on the display area extends to the peripheral area and placed over the first portions of the connection wires.

23 Claims, 7 Drawing Sheets

DISPLAY DEVICE

CROSS-REFERENCE TO RELATED APPLICATION

This application claims priority to and the benefit of Korean Patent Application No. 10-2015-0148198 filed in the Korean Intellectual Property Office on Oct. 23, 2015, the entire contents of which are incorporated herein by reference.

BACKGROUND

Field

The described technology generally relates to a display device.

Description of the Related Technology

Example types of display devices include a liquid crystal display (LCD), a plasma display panel (PDP), an organic light-emitting diode (OLED) display, a field effect display (FED), an electrophoretic display device, and the like.

Particularly, the OLED of each pixel in the display includes two electrodes and an interposed organic emission layer, and emits light while an electron injected from one electrode and a hole injected from the other electrode are combined with each other in the organic emission layer to form an exciton and the exciton discharges energy.

Since the OLED display is characterized by self-luminance and does not require a separate light source, unlike the LCD, its thickness and weight can be reduced. Further, since OLED technology has desirable characteristics such as low power consumption, high luminance, and high response speed, an OLED display is considered to be a next-generation display technology.

SUMMARY OF CERTAIN INVENTIVE ASPECTS

One inventive aspect relates to a display device that can prevent corrosion of wires provided in a peripheral area of a substrate.

Another aspect is a display device that includes: a substrate including a display area where an image is displayed and a peripheral area that neighbors the display area; a plurality of signal lines provided in the display area; an encapsulation layer provided on the plurality of signal lines; a pad portion provided in the peripheral area; and a plurality of connection wires connecting the signal lines and the pad portion, wherein the encapsulation layer provided on the display area is extended and is thus provided on the plurality of connection wires.

A folding area may be provided in the peripheral area of the substrate, and the extended encapsulation layer may overlap the folding area.

A protective film may be disposed below the substrate.

The protective film may not be disposed at a lower portion of the folding area of the substrate.

The substrate may be bent in the folding area, and a support plate may be provided between ends of the substrate that is folded and thus face each other.

An adhesive layer may be provided between the substrate and the support plate.

Encapsulation layer may be formed of a plurality of layers.

The encapsulation layer may be formed by alternately layering inorganic layers and organic layers one by one.

The inorganic layer of the encapsulation layer may be extended and is thus disposed on the plurality of connection wires.

The inorganic layer provided on the plurality of connection wires may be formed of at least two or more layers, each having a different density.

The inorganic layer disposed on the plurality of connection wires may include: a pair of first inorganic layers having a first density; and a second inorganic layer provided between the pair of first inorganic layers and having a second density.

The inorganic layer may be made of at least one of a silicon oxide, a silicon nitride, and a silicon oxynitride.

The encapsulation layer may include: inorganic layers and organic layers that are alternately layered one by one; and a metal oxide layer provided between the inorganic layer and the organic layer, as the topmost layer of the encapsulation layer or as the bottommost layer of the encapsulation layer.

The metal oxide layer may be extended and is thus disposed on the plurality of connection wires.

The metal oxide layer may be made of at least one of aluminum oxide, ITO, zinc oxide, and titanium oxide.

The encapsulation layer may include: inorganic layers and organic layers that are alternately layered one by one; and a hexamethyldisiloxane (HMDSO) layer provided between the inorganic layer and the organic layer, as the topmost layer of the encapsulation layer or as the bottommost layer of the encapsulation layer.

The HMDSO layer may be extended and is thus being disposed on the plurality of connection wires.

The display device may further include a chip-on-film combined to the pad portion.

Another aspect is a display device comprising: a substrate including a display area configured to display an image and a peripheral area surrounding the display area; a plurality of signal lines provided in the display area; an encapsulation layer provided over the signal lines; a pad portion provided in the peripheral area; and a plurality of connection wires connecting the signal lines and the pad portion, wherein each of the connection wires includes a first portion provided in the peripheral area and a second portion provided in the display area, wherein a portion of the encapsulation layer provided on the display area extends to the peripheral area and placed over the first portions of the connection wires.

In the above display device, the peripheral area includes a folding area, and wherein the extended portion of the encapsulation layer overlaps the folding area in the depth dimension of the display device. The above display device further comprises a protective film disposed below the substrate. In the above display device, the protective film is not disposed at a lower portion of the folding area of the substrate. In the above display device, ends of the substrate are configured to be folded and face each other, and wherein the display device further comprises a support plate provided between the ends of the substrate. The above display device further comprises an adhesive layer provided between the substrate and the support plate. In the above display device, the encapsulation layer includes a plurality of layers. In the above display device, the layers include a plurality of inorganic layers and a plurality of organic layers that are alternately formed.

In the above display device, at least one of the inorganic layers extends to the peripheral area so as to be disposed over the connection wires. In the above display device, the inorganic layers have different densities. In the above display device, the inorganic layers comprise: a pair of first inorganic layers having a first density; and a second inorganic layer provided between the first inorganic layers and having a second density. In the above display device, each of the inorganic layers is made of at least one of a silicon oxide, a silicon nitride, and a silicon oxynitride. In the above display device, the encapsulation layer comprises: a plurality of inorganic layers and a plurality of organic layers that are alternately formed; and a metal oxide layer provided between the inorganic layers and the organic layers, as the topmost layer of the encapsulation layer or as the bottommost layer of the encapsulation layer.

In the above display device, the metal oxide layer extends to the peripheral area so as to be disposed over the connection wires. In the above display device, the metal oxide layer is made of at least one of aluminum oxide, ITO, zinc oxide, and titanium oxide. In the above display device, the encapsulation layer comprises: a plurality of inorganic layers and a plurality of organic layers that are alternately formed; and a hexamethyldisiloxane (HMDSO) layer provided between the inorganic layers and the organic layers, as the topmost layer of the encapsulation layer or as the bottommost layer of the encapsulation layer. In the above display device, the HMDSO layer extends to the peripheral area so as to be disposed over the connection wires. The above display device further comprises a chip-on-film combined to the pad portion.

Another aspect is a display device comprising: a substrate including a display area configured to display an image and a peripheral area surrounding the display area; a plurality of signal lines provided in the display area; an encapsulation layer provided over the signal lines; a pad portion provided in the peripheral area; and a plurality of connection wires connecting the signal lines and the pad portion, wherein each of the connection wires includes a first portion provided in the peripheral area and a second portion provided in the display area, wherein the encapsulation layer is disposed over the first and second portions of the connection wires.

In the above display device, the encapsulation layer comprises a bottom layer, a top layer and an intermediate layer interposed between the top and bottom layers, wherein the bottom layer is closer to the substrate than the top layer, wherein one of the top and bottom layers is disposed both in the display area and the peripheral area, and wherein the intermediate layer and the other of the top and bottom layers are disposed only in the display area.

According to at least one of the disclosed embodiments, corrosion of wires disposed in the peripheral area of the substrate due to moisture or salt water from a user's hand can be prevented.

DETAILED DESCRIPTION OF CERTAIN INVENTIVE EMBODIMENTS

In an OLED display, one side of a substrate to which a chip-on-film and the like is attached in a bent state. Such a bent area is disposed at an edge of the display device and contacts a user's hand. In this case, moisture or perspiration on the user's hand may permeate into the display device, thereby causing corrosion of wires in the bent area.

Embodiments will be described more fully hereinafter with reference to the accompanying drawings. As those skilled in the art would realize, the described embodiments may be modified in various different ways, all without departing from the spirit or scope of the present invention. The drawings and description are to be regarded as illustrative in nature and not restrictive. Like reference numerals designate like elements throughout the specification.

In addition, the size and thickness of each configuration shown in the drawings are arbitrarily shown for better understanding and ease of description, but the present invention is not limited thereto.

In the drawings, the thickness of layers, films, panels, regions, etc., are exaggerated for clarity. In the drawings, for better understanding and ease of description, the thickness of some layers and areas is exaggerated. It will be understood that when an element such as a layer, film, region, or substrate is referred to as being "on" another element, it can be directly on the other element or intervening elements may also be present.

In this disclosure, the term "substantially" includes the meanings of completely, almost completely or to any significant degree under some applications and in accordance with those skilled in the art. Moreover, "formed, disposed over positioned over" can also mean "formed, disposed or positioned on." The term "connected" includes an electrical connection.

Figure 1:
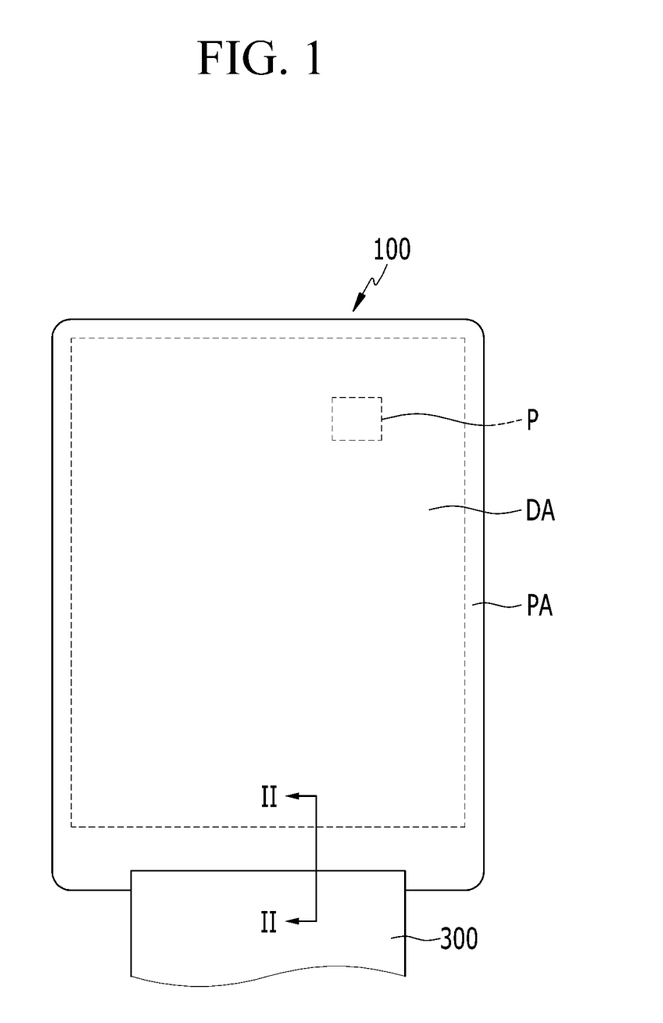
FIG. 1 is a top plan view of a display device according to an exemplary embodiment.
Figure 2:
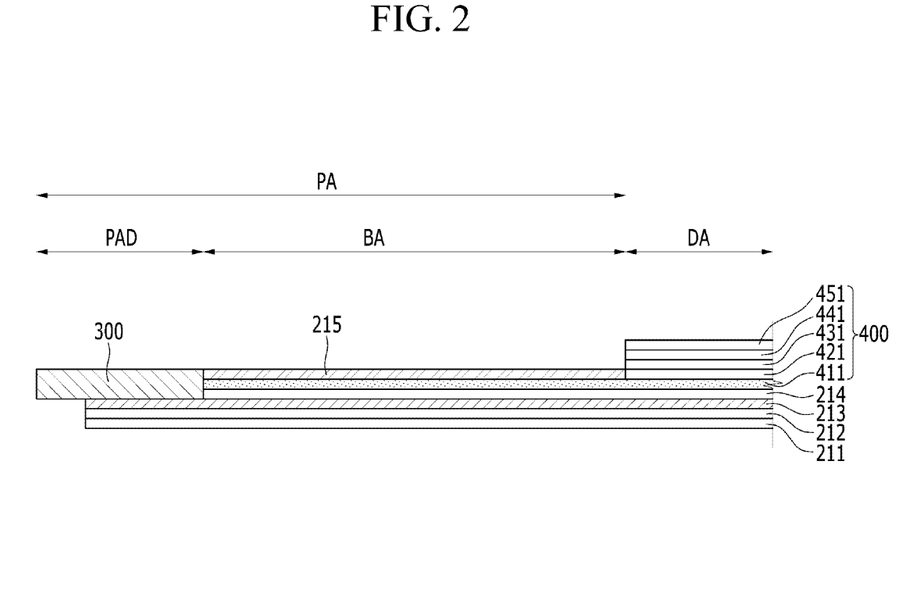
FIG. 2 is a cross-sectional view of FIG. 1, taken along the line II-II.
Figure 3:
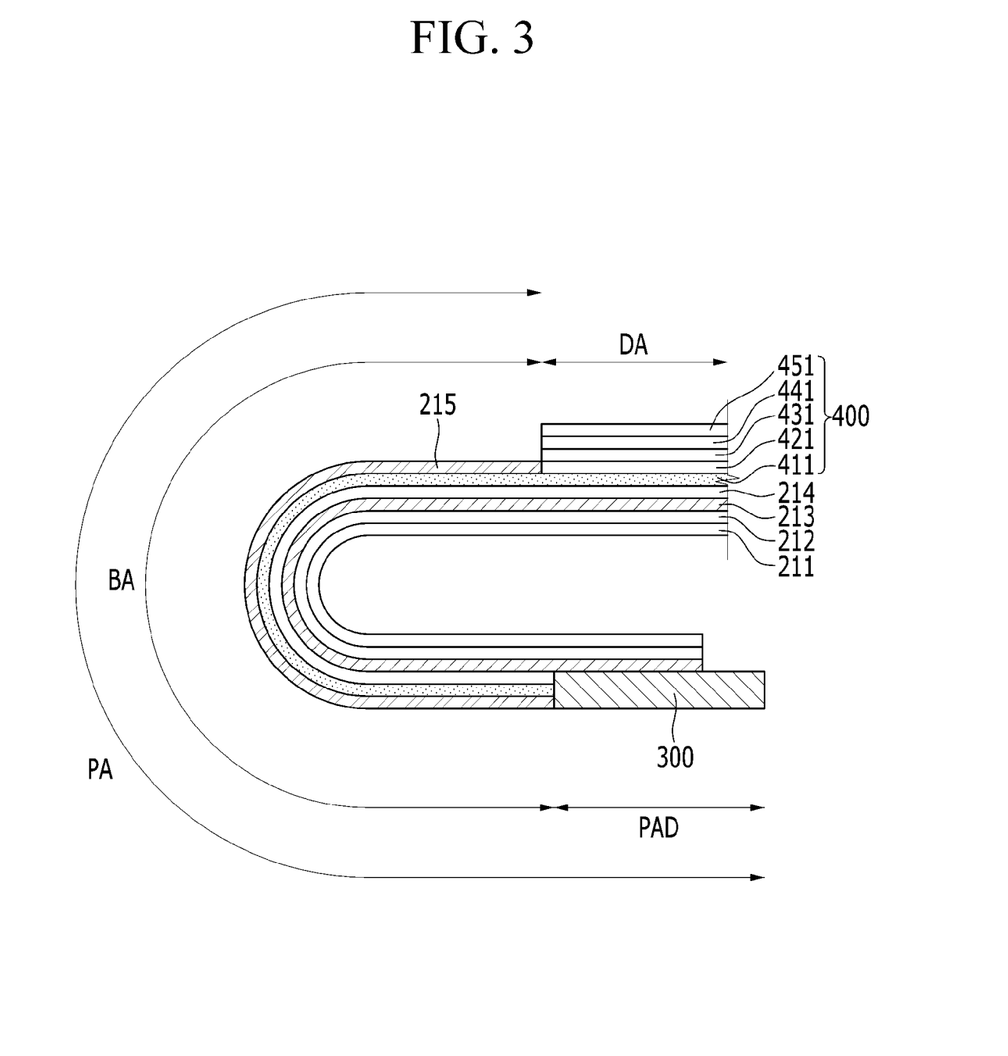
FIG. 3 shows a substrate of FIG. 2 in a bent state.

FIG. 1 is a top plan view of a display device 100 according to an exemplary embodiment, FIG. 2 is a cross-sectional view of FIG. 1, taken along the line II-II, and FIG. 3 shows a substrate of FIG. 2 in a bent state.

Referring to FIG. 1 to FIG. 3, the display device 100 includes a substrate 211, a plurality of connection wires 213, an encapsulation layer 400, and a pad portion PAD.

In some embodiments, a portion of the encapsulation layer 400 provided in a display area DA extends to a peripheral area PA, and the extended encapsulation layer 400 covers the connection wires 213 formed in the peripheral area PA. The extended encapsulation layer 400 prevents corrosion of the connection wires 213 provided therebelow.

Referring to FIG. 1 and FIG. 2, the substrate 211 is divided into the display area DA configured to display an image and the peripheral area PA that neighbors or surrounds the display area DA. The display area DA includes a plurality of pixels P that emit light. The peripheral area PA includes a plurality of connection wires 213 configured to drive the pixels P, a pad portion PAD, and a chip-on-film 300.

The connection wires 213 are provided in the peripheral area PA of the substrate 211. The connection wires 213 connect a plurality of signal lines such as a data line (not shown), a scan line (not shown), and the like formed in the display area DA to the pad portion PAD. In the present exemplary embodiment, the connection wires 213 correspond to a fan-out portion that connects a gate line or a data line with a gate IC or a data IC.

In this case, a buffer layer 212 is provided between the substrate 211 and the connection wires 213. The buffer layer 212 serves to prevent permeation of impurity elements and planarize the surface thereof. The buffer layer 212 may be the same layer as a substrate buffer layer 126 provided on a substrate 123 of FIG. 4.

A wire insulation layer 214 is provided on the connection wires 213. The wire insulation layer 214 partially exposes the connection wires 213 in the pad portion PAD. In this case, the exposed portion of the connection wires 213 may be connected with the chip-on-film 300.

The wire insulation layer 214 may be formed of an acryl-based resin, an epoxy resin, a phenolic resin, a polyamide resin, a polyimide resin, an unsaturated polyester resin, a polyphenylene resin, a polyphenylene sulfide resin, benzocyclobutene (BCB), a silicon nitride (SiNx), or a silicon oxide (SiOx). However, the wire insulation layer 214 may be omitted, and the encapsulation layer 400 may be provided on the connection wires 213.

The chip-on-film 300 is disposed on the pad portion PAD formed by the exposed portion of the connection wires 213, and is electrically connected with the connection wires 213. A driving chip (not shown) used for driving of the pixels P may be installed in the chip-on-film 300.

In this case, the chip-on-film 300 may be provided as a plurality of metal wires (not shown) on a base film (not shown) having flexibility.

The driving chip may be installed in the base film to generate a driving signal. For example, the driving ship may be a scan driving circuit that generates a scan signal by receiving an external control signal, or a data driving circuit that generates a data signal by receiving an external control signal.

According to the present exemplary embodiment, the encapsulation layer 400 is provided on the wire insulation layer 214. As discussed above, a portion of the encapsulation layer 400 provided in the pixel PX of the display area DA extends to the peripheral area PA. The encapsulation layer 400 protects an OLED and a pixel driver in the pixel PX of the display area DA by sealing them.

In the present exemplary embodiment, the extended portion of the encapsulation layer 400 is disposed on the connection wires 213.

Referring to FIG. 3, the peripheral area PA of the substrate 211 may be disposed in the display device while being bent with respect to a folding area or bendable area BA. One end of the substrate 211 combined with the chip-on-film 300 is folded and thus ends of the substrate 211 face each other as shown in FIG. 3.

A portion of the encapsulation layer 400, for example, a portion of the metal oxide layer 411, may overlap the folding area BA, thus being folded together with the connection wires 213.

Figure 7:
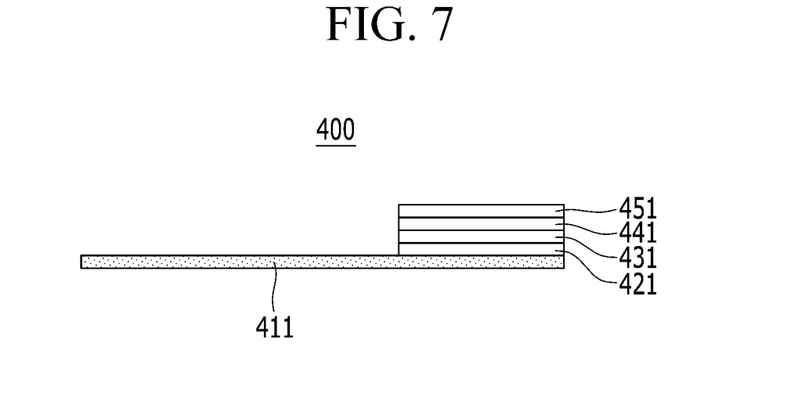
FIG. 7 is a cross-sectional view of an encapsulation layer according to the present exemplary embodiment.

In some embodiments, as shown in FIG. 7, the encapsulation layer 400 is provided as a plurality of layers in the display area DA. The encapsulation layer 400 can be formed by alternately layering a metal oxide layer 411, organic layers 421 and 441, and inorganic layers 431 and 451. That is, the organic layers 421 and 441 and the inorganic layers 431 and 451 are alternately layered on the metal oxide layer 411.

The metal oxide layer 411 is disposed in the bottommost layer of the encapsulation layer 400 in the present exemplary embodiment, but the metal oxide layer 411 may be disposed in the topmost layer of the encapsulation layer 400. Alternatively, the metal oxide layer 411 may be disposed between the alternately layered organic layers 421 and 441 and the inorganic layers 431 and 451.

Referring back to FIG. 2, the metal oxide layer 411 among the encapsulation layers 400 formed of a plurality of layers extends from the display area DA and is thus formed in the peripheral area PA in the present exemplary embodiment. That is, the metal oxide layer 411 may extend and thus be provided on the wire insulation layer 214 of the peripheral area PA.

In this case, the metal oxide layer 411 may be made of at least one of an aluminum oxide (AlOx), indium tin oxide (ITO), zinc oxide (ZnO), and a titanium oxide (TiOx). However, a material of the metal oxide layer 411 is not limited thereto, and a known material used in a thin film encapsulation may be used.

Further, a passivation layer 215 may be provided on the metal oxide layer 411 in the peripheral area PA. The passivation layer 215 can prevent corrosion of the plurality of connection wires 213 provided therebelow by preventing permeation of moisture.

Referring to FIG. 1 and FIG. 3, the folding area BA is disposed at an edge of the display device 100. Accordingly, when the user holds the display device 100, the folding area BA may be adjacent to the user's hand.

In this case, moisture, salt water, and the like from the user's hand may permeate into the folding area BA. Conventionally (not necessarily prior art), when a part of the encapsulation layer 400 is not disposed in the folding area BA, the connection wires 213 may corrode due to the moisture or salt water.

However, in the present exemplary embodiment, a part of the encapsulation layer 400 is disposed on the connection wires 213 such that permeation of moisture, salt water, and the like can be prevented.

That is, in the present exemplary embodiment, the metal oxide layer 411 among the encapsulation layer 40 extends to the peripheral area PA such that corrosion of the connection wires 213 due to moisture, salt water, and the like can be prevented.

Further, the metal oxide layer 411 may be formed in the peripheral area PA at the same time as the encapsulation layer 400 of the display area DA is formed. Thus, neither an additional mask process nor an additional deposition process is necessary. Accordingly, processing time and manufacturing cost can be saved.

The pixels P are disposed in the display area DA. In the following description, a single pixel P will be described in detail with reference to FIG. 4. In the present exemplary embodiment, each pixel P may be formed of an organic light-emitting element.

Figure 4:
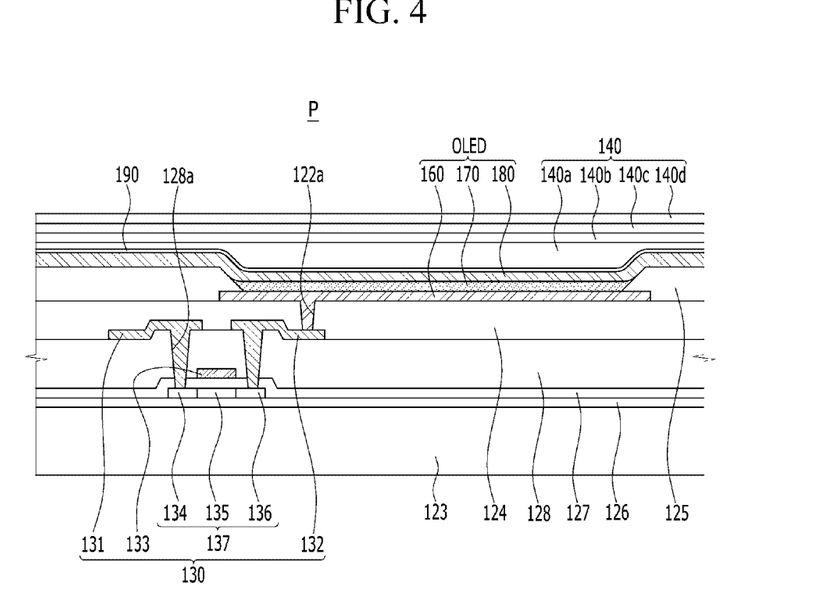
FIG. 4 is an enlarged cross-sectional view of a single pixel of FIG. 1.

Referring to FIG. 4, the substrate 123 may be made of an inorganic material such as glass, a metal material, or an organic material such as a resin. The substrate 123 may have a light transmissive characteristic or a light blocking characteristic. The substrate 123 may be made of the same layer as the substrate 211 of FIG. 2 and FIG. 3.

In addition, the substrate buffer layer 126 is provided on the substrate 123. The substrate buffer layer 126 serves to prevent permeation of impurity elements and planarize the surface thereof.

The substrate buffer layer 126 may be made of various materials that can perform the above-stated functions. For example, the substrate buffer layer 126 may be formed as one of a silicon nitride (SiNx) layer, a silicon oxide (SiOx) layer, and a silicon oxynitride (SiOxNy) layer. However, the substrate buffer layer 126 is not a requisite element, and may be omitted depending on the type and a process condition of the substrate 123.

A driving semiconductor layer 137 is provided on the substrate buffer layer 126. The driving semiconductor layer 137 is formed as a polysilicon layer. Further, the driving semiconductor layer 137 includes a channel region 135 in which impurities are not doped, and a source region 134 and a drain region 136 in which impurities are doped at respective sides of the channel region 135. In this case, the doped ion materials are P-type impurities such as boron (B), and $B_2H_6$ is mainly used. The impurities vary according to a kind of thin film transistor.

A gate insulating layer 127 made of a silicon nitride (SiNx) or a silicon oxide (SiOx) is provided on the driving semiconductor layer 137.

A gate wire including a driving gate electrode 133 is provided on the gate insulating layer 127. In addition, the driving gate electrode 133 is formed to overlap at least a part of the driving semiconductor layer 137, particularly, the channel region 135.

Meanwhile, an interlayer insulating layer 128 covering the driving gate electrode 133 is formed on the gate insulating layer 127. Contact holes 128a exposing the source region 134 and the drain region 136 of the driving semiconductor layer 137 are formed in the gate insulating layer 127 and the interlayer insulating layer 128.

The interlayer insulating layer 128 may be formed by using a ceramic-based material such as a silicon nitride (SiNx) or a silicon oxide (SiOx), like the gate insulating layer 127.

In addition, a data wire including a driving source electrode 131 and a driving drain electrode 132 is provided on the interlayer insulating layer 128. Further, the driving source electrode 131 and the driving drain electrode 132 are connected with the source region 134 and the drain region 136 of the driving semiconductor layer 137 through the contact holes 128a formed in the interlayer insulating layer 128 and the gate insulating layer 127, respectively.

As such, a driving thin film transistor 130 including the driving semiconductor layer 137, the driving gate electrode 133, the driving source electrode 131, and the driving drain electrode 132 is formed. The configuration of the driving thin film transistor 130 is not limited to the aforementioned example, and may be variously modified as a known configuration which may be easily implemented by those skilled in the art.

In addition, a planarization layer 124 covering the data wire is provided on the interlayer insulating layer 128. The planarization layer 124 serves to remove and planarize a step in order to increase emission efficiency of the organic light-emitting element to be formed thereon. Further, the planarization layer 124 has an electrode via hole 122a exposing a part of the drain electrode 132.

The planarization layer 124 may be made of one or more materials of a polyacrylate resin, an epoxy resin, a phenolic resin, a polyamide resin, a polyimide resin, an unsaturated polyester resin, a polyphenylene ether resin, a polyphenylene sulfide resin, and benzocyclobutene (BCB).

Here, the described technology is not limited to the aforementioned structure, and in some cases, one of the planarization layer 124 and the interlayer insulating layer 128 may be omitted.

In this case, a first electrode of the organic light-emitting element, that is, a pixel electrode 160, is formed on the planarization layer 124. That is, the OLED display includes a plurality of pixel electrodes 160 which are disposed for every plurality of pixels, respectively. In this case, the pixel electrodes 160 are disposed separately from each other. The pixel electrode 160 is connected to the driving drain electrode 132 through the electrode via hole 122a of the planarization layer 124.

Further, a pixel defining layer 125 having an opening exposing the pixel electrode 160 is formed on the planarization layer 124. That is, the pixel defining layer 125 has a plurality of openings formed for each pixel.

In this case, an organic emission layer 170 may be formed for each opening formed by the pixel defining layer 125. Accordingly, a pixel area where each organic emission layer is formed may be defined by the pixel defining layer 125.

In this case, the pixel electrode 160 is disposed to correspond to the opening of the pixel defining layer. However, the pixel electrode 160 is not only disposed in the opening of the pixel defining layer 125, and may be disposed below the pixel defining layer 125 so that a part of the pixel electrode 160 overlaps with the pixel defining layer 125.

The pixel defining layer 125 may be made of a resin such as a polyacrylate resin and a polyimide resin, a silica-based inorganic material, or the like.

The organic emission layer 170 is formed on the pixel electrode 160.

In addition, a second electrode, that is, a common electrode 180, may be formed on the organic emission layer 170. As such, the OLED including the pixel electrode 160, the organic emission layer 170, and the common electrode 180 is formed.

Each of the pixel electrode 160 and the common electrode 180 may be made of a transparent conductive material or a transflective or reflective conductive material. According to kinds of materials forming the pixel electrode 160 and the common electrode 180, the OLED display may be a top emission type, a bottom emission type, or a double-sided emission type.

Meanwhile, an overcoat 190 covering and protecting the common electrode 180 may be formed as an organic layer on the common electrode 180.

In addition, an encapsulation layer 140 is provided on the overcoat 190. The encapsulation layer 140 encapsulates and protects the OLED and a pixel driver provided in the substrate 123 from the outside. The encapsulation layer 140 is formed the same as the encapsulation layer 400 of FIG. 2 and FIG. 3.

The encapsulation layer 140 includes organic encapsulation layers 140a and 140c and inorganic encapsulation layers 140b and 140d that are alternately layered. In FIG. 4, for example, a case where two organic encapsulation layers 140a and 140c and two inorganic encapsulation layers 140b and 140d are alternately laminated to configure the thin film encapsulation layer 140 is illustrated, but it is not limited thereto. As described above, the metal oxide layer 411 may be provided below the organic encapsulation layer 140a among the encapsulation layer 140.

Hereinafter, referring to FIG. 8 and FIG. 9, first to third exemplary variations of the encapsulation layer of the display device according to the exemplary embodiment will be described. In the description of the first to third exemplary variations, a detailed description with respect to configurations that are the same as the above-described exemplary embodiment will be omitted.

Figure 8:
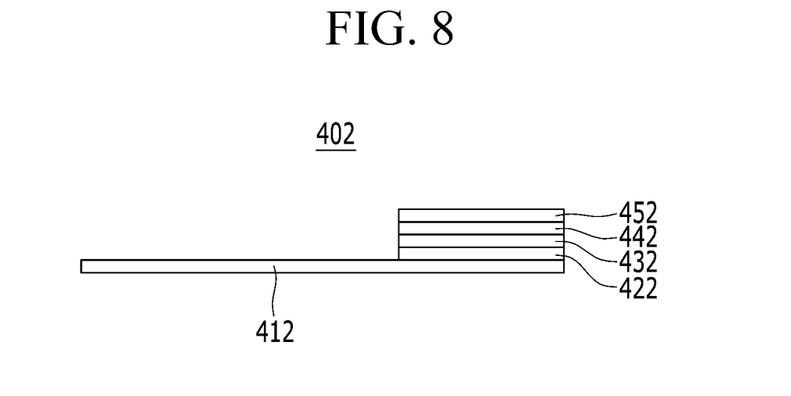
FIG. 8 shows a first exemplary variation of the encapsulation layer of the present exemplary embodiment.
Figure 9:
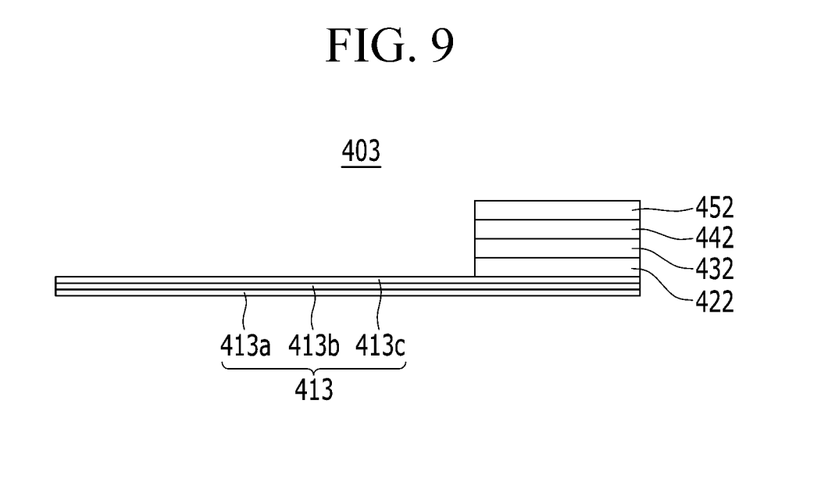
FIG. 9 shows a second exemplary variation of the encapsulation layer of the present exemplary embodiment.

FIG. 8 shows a first exemplary variation of the encapsulation layer according to the present exemplary embodiment, and FIG. 9 shows a second exemplary variation of the encapsulation layer according to the present exemplary embodiment.

Referring to FIG. 8, in the first exemplary variation, an encapsulation layer 402 is formed by alternately layering an organic layer and an inorganic layer in a display area DA, and one of the inorganic layers (see 412) extends to a peripheral area PA. That is, in the present exemplary variation, an inorganic layer provided between organic layers, the upper most inorganic layer, or the bottommost inorganic layer is extended to the peripheral area PA.

More specifically, each of organic layers 422 and 442 and each of inorganic layers 432 and 452 are alternately layered, and an inorganic layer 412 is disposed in a lower portion of the organic layer 422, that is, the inorganic layer 412 is disposed as the bottommost layer.

The bottommost inorganic layer 412 is extended to the peripheral area PA. That is, the inorganic layer 412 is extended and is thus disposed on a wire insulation layer 214 of the peripheral area PA. In this case, the inorganic layer may include at least one of a silicon oxide (SiOx), a silicon nitride (SiNx), and a silicon oxynitride (SiON).

Referring to FIG. 9, in the second exemplary variation, an encapsulation layer 403 is formed by alternately layering an organic layer and an inorganic layer in a display area DA, and one of the inorganic layers is extended to a peripheral area PA. That is, in the present exemplary variation, an inorganic layer provided between organic layers, the upper most inorganic layer, or the bottommost inorganic layer is extended to the peripheral area PA. In this case, the inorganic layer may be formed of at least two or more layers, each having a different density.

More specifically, in the second exemplary variation, organic layers 422 and 442 and inorganic layers 432 and 452 are alternately layered one by one, and an inorganic layer 413 formed as layers respectively having different density is disposed in a lower portion of the organic layer 422, that is, the bottommost layer. The inorganic layer 413 may be extended to the peripheral area PA.

In the second exemplary variation, the inorganic layer 413 may be formed of a pair of first inorganic layers 413a and 413c, each having a first density, and a second inorganic layer 413b provided between the pair of first inorganic layers 413a and 413c. In this case, the second inorganic layer 413b has a second density that is different from the first density of the first inorganic layer 413a and 413c.

For example, the pair of first inorganic layers 413a and 413c may have a density of 1.8 g/cm$^3$, and the second inorganic layer 413b may have a density of 3.0 g/cm$^3$. In this case, the first inorganic layer 413a may be made of a silicon oxide (SiOx), the first inorganic layer 413c may be made of a silicon nitride (SiNx), and the second inorganic layer 413b may be made of a silicon oxynitride (SiON).

Meanwhile, according to the third exemplary variation, an encapsulation layer 400 is formed by alternately layering a hexamethyldisiloxane (HMDSO) layer (not shown), organic layers 421 and 441, and inorganic layers 431 and 451. That is, the organic layers 421 and 441 and the inorganic layers 431 and 451 are alternately layered one by one on the HMDSO layer (not shown).

However, in the present exemplary embodiment, the HMDSO layer is disposed as the bottommost layer of the encapsulation layer 400, but this is not restrictive. The HDMSO layer may be provided as the topmost layer of the encapsulation layer 400. Alternatively, the HMDSO layer (not shown) may be disposed between the alternately layered organic layers 421 and 441 and inorganic layers 431 and 451.

Among the encapsulation layer 400 formed of a plurality of layers, the HMDSO layer (not shown) is extended from the display area DA and is thus formed in the peripheral area PA. That is, the HMDSO layer (not shown) is extended and thus provided on a wire insulation layer 214 of the peripheral area PA. The third exemplary variation is different from the exemplary embodiment of FIG. 2 and FIG. 3 in that the HDMSO layer (not shown) is disposed instead of the metal oxide layer 411.

The HMDSO layer serves to absorb stress of the encapsulation layer 400 to provide flexibility. The HMDSO layer is essentially an inorganic layer, but has a flexible characteristic like an organic layer. Thus, the HMDSO layer can effectively absorb the stress of the encapsulation layer 400 with flexibility like an organic layer, and at the same time it may be deposited in a chamber where the inorganic layer 431 and 451 of the encapsulation layer 400 are formed since the HDMSO layer is essentially an inorganic layer.

Hereinafter, a display device according to another exemplary embodiment will be described with reference to FIG. 5 and FIG. 6. Like reference numerals refer to constituent elements that are identical to those of the aforementioned exemplary embodiment.

Figure 5:
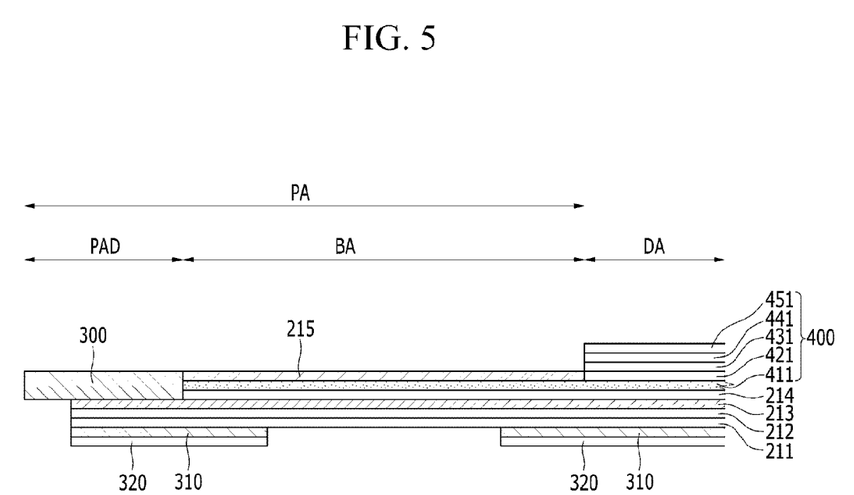
FIG. 5 is a cross-sectional view of a display device according to another exemplary embodiment.
Figure 6:
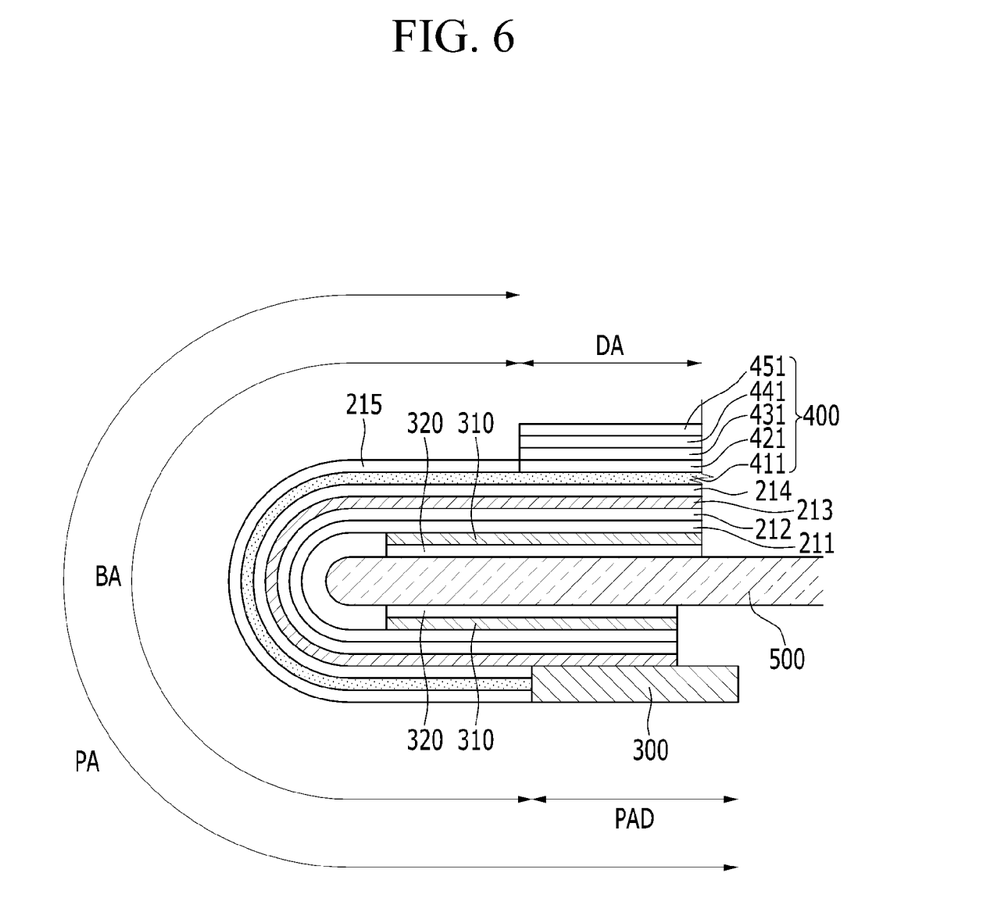
FIG. 6 shows a substrate of FIG. 5 in a bent state.

FIG. 5 is a cross-sectional view of a display device according to another exemplary embodiment, and FIG. 6 shows a substrate of FIG. 5 in a bent state.

Referring to FIG. 5 and FIG. 6, a protective film 310 is disposed below the substrate 211. In this case, the protective film 310 may prevent permeation of moisture and the like to the substrate 211 or prevent damage to the substrate 211 due to an external impact.

The protective film 310 is not disposed below a folding area BA. That is, the protective film 310 may be disposed below the substrate 211, except at the lower portion of the folding area BA. However, the protective film 310 may be provided only in the peripheral area PA or may be provided in the peripheral area PA and the display area DA.

A support plate 500 is provided between the ends of the substrate 211 that is bent and thus they face each other. The support plate 500 maintains the ends of the substrate 211 to face each other while lateral ends of the substrate 211 to which a chip-on-film 300 is attached are being folded.

In the present exemplary embodiment, an adhesive layer 320 is provided between the support plate 500 and the substrate 211, and thus the substrate 211 where the chip-on-film 300 is attached is fixed to the support plate 500. Accordingly, the substrate 211 can maintain the folded state.

The display device according to the exemplary embodiment, a portion of an encapsulation layer 400 provided in a pixel P of the display area DA extends to the peripheral area PA such that corrosion of a plurality of connection wires 213 provided below the encapsulation layer 400 can be prevented. Further, the encapsulation layer 400 can be formed simultaneously with an encapsulation layer of the display area DA such that manufacturing time and manufacturing cost can be saved.

While the inventive technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
   a substrate including a display area configured to display an image and a peripheral area surrounding the display area;
   a plurality of signal lines provided in the display area;

an encapsulation layer provided over the signal lines;
a pad portion provided in the peripheral area; and
a plurality of connection wires connecting the signal lines and the pad portion,
wherein each of the connection wires includes a first portion provided in the peripheral area and a second portion provided in the display area,
wherein the encapsulation layer is disposed over the first and second portions of the connection wires.

2. The display device of claim 1, wherein the encapsulation layer comprises a bottom layer, a top layer and an intermediate layer interposed between the top and bottom layers, wherein the bottom layer is closer to the substrate than the top layer, wherein one of the top and bottom layers is disposed both in the display area and the peripheral area, and wherein the intermediate layer and the other of the top and bottom layers are disposed only in the display area.

3. A display device comprising:
a substrate including a display area configured to display an image and a peripheral area surrounding the display area;
a plurality of signal lines provided in the display area;
at least one encapsulation layer provided over the signal lines;
a pad portion provided in the peripheral area; and
a plurality of connection wires connecting the signal lines and the pad portion, wherein each of the connection wires includes a first portion provided in the peripheral area and a second portion provided in the display area,
wherein a portion of the encapsulation layer provided on the display area extends to the peripheral area and placed over the first portions of the connection wires.

4. The display device of claim 3, wherein the encapsulation layer comprises a bottom layer formed over the substrate, a plurality of inorganic layers and a plurality of organic layers that are alternately formed over the bottom layer, wherein the bottom layer is formed both in the display and peripheral areas, and wherein the plurality of inorganic layers and organic layers are formed only in the display area.

5. The display device of claim 3, wherein the portion of the encapsulation layer extends beyond the display area so as to be formed on the peripheral area.

6. The display device of claim 3, further comprising a chip-on-film combined to the pad portion.

7. The display device of claim 3, wherein the encapsulation layer comprises:
a plurality of inorganic layers and a plurality of organic layers that are alternately formed; and
a hexamethyldisiloxane (HMDSO) layer provided between the inorganic layers and the organic layers, as the topmost layer of the encapsulation layer or as the bottommost layer of the encapsulation layer.

8. The display device of claim 7, wherein the HMDSO layer extends to the peripheral area so as to be disposed over the connection wires.

9. The display device of claim 3, wherein the encapsulation layer includes a first region provided on the display area and a second region continuously extends from the first region and provided on the peripheral area.

10. The display device of claim 9, wherein each of the first portions of the connection wires has top and bottom surfaces opposing each other, wherein the bottom surface faces the substrate, and wherein the second region of the encapsulation layer is directly located above the top surface of the first portion of each connection wire.

11. The display device of claim 3, wherein the encapsulation layer comprises:
a plurality of inorganic layers and a plurality of organic layers that are alternately formed; and
a metal oxide layer provided between the inorganic layers and the organic layers, as the topmost layer of the encapsulation layer or as the bottommost layer of the encapsulation layer.

12. The display device of claim 11, wherein the metal oxide layer extends to the peripheral area so as to be disposed over the connection wires.

13. The display device of claim 11, wherein the metal oxide layer is made of at least one of aluminum oxide, ITO, zinc oxide, and titanium oxide.

14. The display device of claim 3, wherein the peripheral area includes a folding area, and wherein the extended portion of the encapsulation layer overlaps the folding area in the depth dimension of the display device.

15. The display device of claim 14, further comprising a protective film disposed below the substrate.

16. The display device of claim 15, wherein the protective film is not disposed at a lower portion of the folding area of the substrate.

17. The display device of claim 16, wherein ends of the substrate are configured to be folded and face each other, and wherein the display device further comprises a support plate provided between the ends of the substrate.

18. The display device of claim 17, further comprising an adhesive layer provided between the substrate and the support plate.

19. The display device of claim 3, wherein the encapsulation layer includes a plurality of inorganic layers and a plurality of organic layers that are alternately formed.

20. The display device of claim 19, wherein each of the inorganic layers is made of at least one of a silicon oxide, a silicon nitride, and a silicon oxynitride.

21. The display device of claim 19, wherein at least one of the inorganic layers extends to the peripheral area so as to be disposed over the connection wires.

22. The display device of claim 21, wherein the at least one of the inorganic layers that are disposed over the connection wires include at least two or more layers, and the at least two or more layers have different densities.

23. The display device of claim 22, wherein the inorganic layers comprise:
a pair of first inorganic layers having a first density; and
a second inorganic layer provided between the first inorganic layers and having a second density.

* * * * *